Nov. 7, 1961 V. M. PANARITI 3,007,997

PRINTED CIRCUIT BOARD

Filed July 1, 1958

INVENTOR:
VIKTOR M. PANARITI,

BY T. E. Kristofferson
HIS ATTORNEY.

3,007,997
Patented Nov. 7, 1961

3,007,997

PRINTED CIRCUIT BOARD

Viktor M. Panariti, New Hartford, N.Y., assignor to General Electric Company, a corporation of New York Filed July 1, 1958, Ser. No. 746,026
2 Claims. (Cl. 174—68.5)

Figure 1:
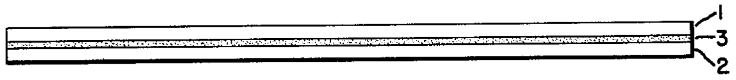

This application relates to a method for producing laminated printed circuits boards and a structure thereof, and more particularly to such a method adapted for providing structures, such as printed circuit boards, which internally damp destructive vibratory forces.

Several problems exist in the printed circuit board field due to the vibration of the boards. These are mainly due to resonant vibration at the fundamental frequency. When a board is subjected to external vibration excitation like that resulting from the flight of an airplane or missile and the frequencies of the external excitation comprise the natural frequency of the board, the board will vibrate at its own resonant frequency. This phenomenon of resonance results in amplification of the vibration amplitudes by the board. Thus, the board is subject, and subjects component parts mounted on it, to vibratory forces much higher than the original external vibration excitation source. The effects on the boards are of two kinds. High surface stresses on the board itself occur, which are more pronounced at the low frequencies where more bending of the board is involved. High inertia forces are also present, associated with the masses of the component parts mounted on the boards, which are more prevalent at the higher frequencies where amplifications are higher though bending of the board is less pronounced. The results of vibration are that wires are broken at soldered joints, component leads are broken, components themselves are broken and the printed wiring is parted from its backing. Failures have occurred in these printed boards with inputs to combined packages as low as $\pm 2g$ although the component parts themselves can withstand vibration levels as high, and often much higher, than $\pm 20g$ input when vibrated separately. The transmissibility of the board, which is the ratio of output acceleration to input acceleration excitation and has an electrical analogy to an amplification factor of a resonant circuit, is generally very high on the order of from 20 to 80, indicating that transmissibility is one of the main causes for failure due to vibration in component parts mounted on printed boards. Prior art methods of solving this problem have generally employed external type damping techniques, such as special mountings, dash pots, or slugs or weights added to the boards to increase their mass in order to reduce vibration amplitudes. Accordingly, it is an object of this invention to provide a new and novel method and structure for providing an internally damped printed circuit board.

Another object of this invention is to provide an easily constructed, highly damped, printed board.

Still another object of this invention is to prevent breakage due to vibratory forces of components and of printed wiring mounted on printed circuit boards.

A further object of this invention is to reduce the transmissibility of printed circuit boards.

A further object of this invention is to provide an improved printed wiring board assembly.

A still further object of this invention is to provide simplified internally damped printed circuit boards capable of reliable use under conditions where high vibratory forces exist.

In carrying out this invention in one form thereof, an internally damped printed circuit board is constructed using alternate layers of rigid board such as a phenolic board and an adhesive material such as silicone-rubber-base cement.

Figure 2:
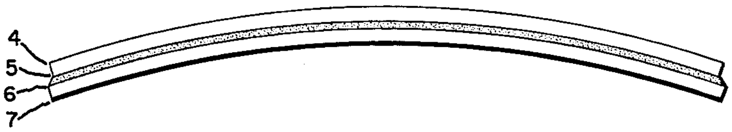
Figure 3:
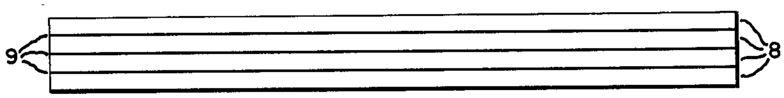
Figure 4:
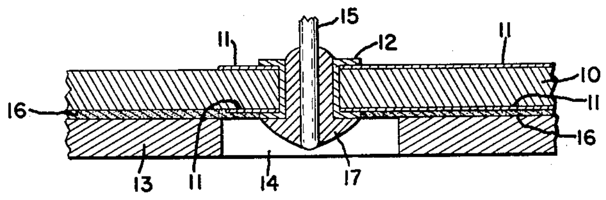

The novel features characteristic of the invention are set forth with particularity in the appended claims. The invention itself, however, together with further objects and advantages thereof, can best be understood by reference to the following description taken in connection with the accompanying drawings in which:

FIG. 1 illustrates one construction of an internally damped printed circuit board, FIG. 2 illustrates the board of FIG. 1 vibrating, as at resonance, in its fundamental mode of vibration, FIG. 3 illustrates a second board construction having a larger number of alternate layers, and FIG. 4 illustrates a board construction and component mounting technique.

Turning now to the drawings, in FIG. 1 there is illustrated a printed circuit board consisting of two layers, 1 and 2, of a rigid material cemented together by a layer 3 of adhesive material. A typical material, which can be used for the layers 1 and 2, is phenolic board. These layers may be from approximately .001 to .25 inch thick. The layer 3, in one embodiment, might comprise a silicone-rubber-base cement having a thickness of from .001 to .125 inch. An alternative construction for the thicker elastic layers could employ a layer of rubber bonded on each side to a layer of rigid board.

The maximum damage due to vibration is caused when a board such as that shown in FIG. 1 vibrates at resonance in its fundamental mode, and particularly where the amplitude at the resonant point is the greatest. This condition is illustrated in FIG. 2 where the layers 1, 2 and 3 are again illustrated and are the same as those in FIG. 1. Here, the upper portion of the layer 1, labelled 4, can be seen to be in tension while the bonding surface 5, between layers 1 and 3, is in compression. The bonding surface 6, between layers 2 and 3, is in turn in tension while the lower portion 7 of the layer 2 is in compression. This bending generates shear stresses between the layers. In an ordinary phenolic board this results in a minimum of friction damping. The properties of the phenolic do not permit sufficient slippage between laminations due to the rigid bonding process used in making the boards. To increase this damping the board shown in FIG. 1 was constructed, thus creating layers that would slip on each other enough to give good friction damping while employing an adhesive capable of bonding rigid layers satisfactorily so that they will not peel apart. Results show great reduction in transmissibility, and the Q's or the maximum transmissibility at resonance of plain boards on the orders of 60 were reduced to the order of ten to five on laminated boards having the same size and thickness. The greatest damping is obtained at the fundamental resonant frequency with a lesser damping at higher frequencies which is still sufficient, however, to reduce the transmissibility to acceptable levels.

While phenolic board has been mentioned as being suitable for layers 1 and 2, it will be obvious that any rigid material which is electrically nonconductive would be suitable and that several adhesive materials would be suitable for use as the layer 3. The use of a silicone-rubber-base cement is highly desirable as it tends to retain the electrical characteristics of the boards under high temperature conditions and aging. However, there are other adhesives capable of performing this function.

FIG. 3 illustrates a board having a multitude of layers 8 of rigid material interspersed with layers 9 of adhesive material. A board consisting of six laminations or layers 8 of $\frac{1}{64}$ inch thick phenolic, cemented with a silicone-rubber-base cement, has been found to be highly desirable from the standpoint of displaying an extremely low Q.

FIG. 4 illustrates a board of the type shown in FIG. 1 containing structure for mounting a component thereon. A board 10 having wiring 11 printed on two sides has an eyelet 12 inserted therethrough in order to make an electrical connection between the wiring 11 on opposite sides of board 10. A back-up board 13, having an aperture 14 underlying eyelet 12 for making a connection therethrough to a component part lead 15, is cemented to the board 10 by an adhesive 16. Aperture 14 extends sufficiently beyond the diameter of eyelet 12 to allow solder 17 for securing lead 15 to flow through and around eyelet 12. This construction is adapted for use in a dip soldering process. The back-up board 13 is partially emersed in the solder and the solder 17 is caused to rise in eyelet 12 through capillary action. The solder 17 sticks to the lower portion of the eyelet 12 but not to the back-up board 13 or to the portion of the adhesive 16 exposed in aperture 14. In this form of construction the printing of the board 10 takes place before the second board backing layer 13 is cemented to it by the adhesive 16. The eyelet 12 is soft enough so as not to place undue restrictions on the relative motion between laminations resulting in the desired friction damping.

Boards of the type illustrated may be mounted, preferably in four corners, by a metal spacer where it is necessary to ground a point on the board through the spacer. In order to achieve optimum advantage from the laminated boards described, mounting points should be at least two inches apart. Any mounting point at which electrical contact is not required may be constructed of a metal spacer or other type of mount such as a shock mount. The spacers are normally required in order to avoid shorting any component lead ends protruding from the back of the board, which positioning makes the board more susceptible to vibration.

While specific embodiments have been disclosed and specific materials have been disclosed for use in the method and construction of the structure of an internally damped printed circuit board, it will be obvious to those skilled in the art that many alternative constructions and equivalent materials are applicable. It is, therefore, intended that the scope of the present invention be only limited by the appended claims which are intended to cover and embrace any such modification.

What is claimed as the invention and desired to be secured by Letters Patent of the United States is:

1. A highly vibration damped printed circuit board and means for making an electrical connection thereto comprising, a first layer of rigid electrically, nonconductive material, printed wiring on both sides of said first layer, at least one eyelet protruding through said first layer in order to connect sections of said printed wiring on opposite sides of said first layer, a second layer of rigid electrically nonconductive material, a layer of adhesive material bonding said first and second layers, and said second layer having an aperture therethrough underlying each of said eyelets through which it is desired to connect a component lead.

2. A highly vibration damped printed wiring board assembly comprising, a first rigid nonconductive board having wiring printed on at least one side thereof, a second board having one side laminated to one side of said first board with a layer of relatively non-rigid, nonconductive material, concentric openings in said laminated boards, and means for solder connecting an electrical lead to said wiring through said openings, one of said openings being sufficiently larger than the other opening to facilitate admission of said solder and the effecting of said connection.

References Cited in the file of this patent

UNITED STATES PATENTS

| | | |
|---|---|---|
| 1,899,588 | Rahlfs | Feb. 28, 1933 |
| 1,973,124 | Swan et al. | Sept. 11, 1934 |
| 2,112,241 | Hyde | Mar. 29, 1938 |
| 2,376,854 | Saunders et al. | May 22, 1945 |
| 2,444,059 | Neher et al. | June 29, 1948 |
| 2,502,286 | Sowa | Mar. 28, 1950 |
| 2,699,424 | Nieter | Jan. 11, 1955 |
| 2,832,935 | Tank | Apr. 29, 1958 |
| 2,848,359 | Talmey | Aug. 19, 1958 |

FOREIGN PATENTS

| | | |
|---|---|---|
| 738,575 | Great Britain | Oct. 19, 1955 |
| 753,875 | Great Britain | Aug. 1, 1956 |

OTHER REFERENCES

Publication I: "Shatter-Resistant Plastic Glazing," published in Modern Plastics, August 1944 (pages 85–89 relied on).